United States Patent
Rabkin et al.

[19]

[11] Patent Number: 5,828,223
[45] Date of Patent: Oct. 27, 1998

[54] UNIVERSAL CHIP TESTER INTERFACE DEVICE

[76] Inventors: Richard Rabkin; Ken Berling; Robert Besuner; James Lubin; David Estrich, all of 30 Liberty Ship Way, Ste. 208, Sausalito, Calif. 94965

[21] Appl. No.: 738,802

[22] Filed: Oct. 28, 1996

[51] Int. Cl.[6] ................................................. G01R 31/02
[52] U.S. Cl. ....................................... 324/754; 324/158.1
[58] Field of Search ................................... 324/754, 758, 324/158.1, 73.1; 414/416, 417

[56] References Cited

U.S. PATENT DOCUMENTS

| | | | |
|---|---|---|---|
| 5,073,079 | 12/1991 | Akagawa | 414/416 |
| 5,223,785 | 6/1993 | Becker | 324/158.1 |
| 5,751,151 | 5/1998 | Levy et al. | 324/754 |
| 5,754,057 | 5/1998 | Hama et al. | 324/758 |

*Primary Examiner*—Ernest F. Karlsen
*Attorney, Agent, or Firm*—Joseph L. Strabala

[57] ABSTRACT

In a robotic test machine for testing chips, often referred to as automatic chip test equipment, a novel interface between the chips being tested and the test head loadboard, allowing rapid changes of products being tested, includes a docking plate with vertical supports, a housing mounted above the docking plate on the vertical supports and having actuators associated therewith and an array of male header pin assemblies mounted on its surface, plus a socket plate with apertures therein adapted to receive the array of header assemblies along with means for connecting it to the actuators whereby the female pin connectors on multiple chip test boards mounted on the socket plate can be connected to an individual header assembly in the array when the socket plate is mated with the housing plate by the actuators. Further, the novel interface can be connected to a mainframe computer for testing the chips with shorter leads than in prior art devices by placing a mainframe computer on a mobile cart, cooperating with the movable interface and connecting the computer to an electrical power source and cooling medium through a rolling or tractor conduit whereby the mainframe computer moves toward and away from the chip handler with the interface.

8 Claims, 6 Drawing Sheets

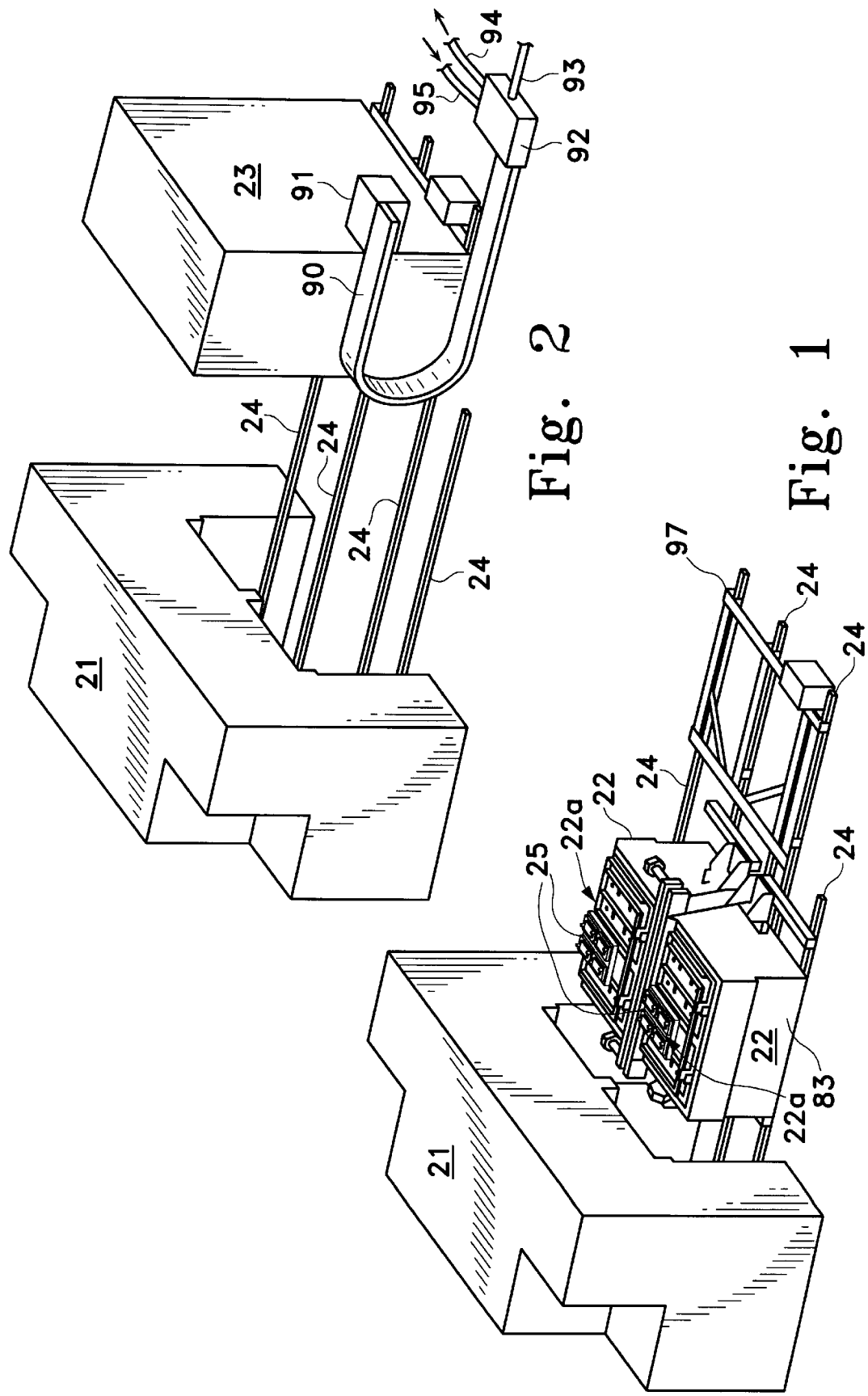

UNIVERSAL CHIP TESTER INTERFACE DEVICE

BACKGROUND OF THE INVENTION

In manufacturing electronic chips one of the latter steps in the process is testing the completed chips. This is typically accomplished by robotic chip handlers wherein the chips are plugged into a test socket, tested and then removed from the test socket, all automatically. Thereafter, the handler sorts the chips according the information obtained in the testing sequence that it receives from the computer making the tests.

The area of this invention is an interface unit which carries the test sockets and connects these sockets to the mainframe computer which accomplishes the chip testing. In the past sockets for the products under test were mounted on boards and hardwired to coaxial cables, which cables in turn were connected through plugs to a test head loadboard connected to the mainframe computer. As a result, each time there was a change of product, all the boards carrying the test sockets and coaxial cables had to be removed and new sockets mounted on new boards and hardwired to new coaxial cables that were then plugged into the test head loadboard. Further such prior art devices could not use 'through hole pin technology' (header pin assemblies) without employing intermediate routing in printed circuit boards used for the chips, leading to extended signal path lengths arid additional pin or connection assemblies.

In contrast the instant invention requires no traditional hardwiring to the cables because the test sockets are carried on test boards mounted on a socket plate so that the female pin connectors on the test boards will be properly positioned over a header pin assembly arrays and connected thereto when the actuators move the socket plate into the housing plate. Further, the actuators provide the necessary mechanical forces to move the pin connectors of the test boards onto header pin assemblies and disengage them from these assemblies, which may require three hundred pounds of force or more to accomplish such tasks.

Thus, according to this invention when a new product is to be tested, the socket plate is removed after being lifted off the header assemblies by the actuators and another socket plate, with the new chip test boards mounted thereon, is placed in the interface. Thereafter the new socket plate is lowered onto the housing plate by the actuators connecting the new (or different) chip test boards to the mainframe computer through the existing header assemblies.

A real advantage is obtained by such a quick change over different products without any typical hardwiring or new cables, resulting in a cost savings of $30,000 or more for each product tested.

With multiple socket plates, One for each product requiring testing and having the chip test boards mounted thereon, a change from one product to another can be accomplished in about a minute, which allows the robotic chip tester to be used much more efficiently.

In addition the use of the invention provides improved electrical connection integrity over prior art devices, ensuring better quality control in the testing procedure.

It is also an advantage in that the individual socket plates with specific chip test boards are easy to handle and store, which is not the case with the prior art devices.

Other advantages will be obvious when referring to the specification and description of the drawings.

SUMMARY OF THE INVENTION

An interface device designed to accomplish rapid product changes in a robotic chip testing machine includes a support plate having a plurality of vertical supports mounted thereon, a housing plate mounted on the vertical supports with the housing plate having a plurality of pneumatic actuators associated therewith and operable to access assemblies above said housing plate, a plurality of male header pin assemblies mounted on the top surface of the housing plate; and a socket plate with a plurality of apertures which register with said plurality of header assemblies on the housing plate along with coupling means operable to engage and disengage with said actuators whereby when the coupling means is engaged, initiation of the actuators will move said socket plate toward the housing plate causing a pin portion of said header assemblies to be received in the apertures in the socket plate thereby connecting any female pin connectors disposed in these apertures to an associated male header pin assembly and the actuators can be operated to disengage these connections.

In addition the interface can be connected to a computer mainframe on carts (wheels) and rails so that the computer moves with the interface when the latter is moved into and out of the chip handler by employing a rolling conduit with the computer to provide it with power and cooling.

BRIEF DESCRIPTION OF THE DRAWINGS

The invention will be better understood by referring to the specifications and the descriptions of its drawings, wherein:

FIG. 1 is a perspective of a chip handler with the novel interface withdrawn and the mainframe computer missing;

FIG. 2 is the same perspective as FIG. 1 with the mainframe computer present without the interface, illustrating the tractor cable containing the electrical power leads and cooling medium tubes for the mainframe computer which does the testing;

DESCRIPTION OF A PREFERRED EMBODIMENT

Figure 3:
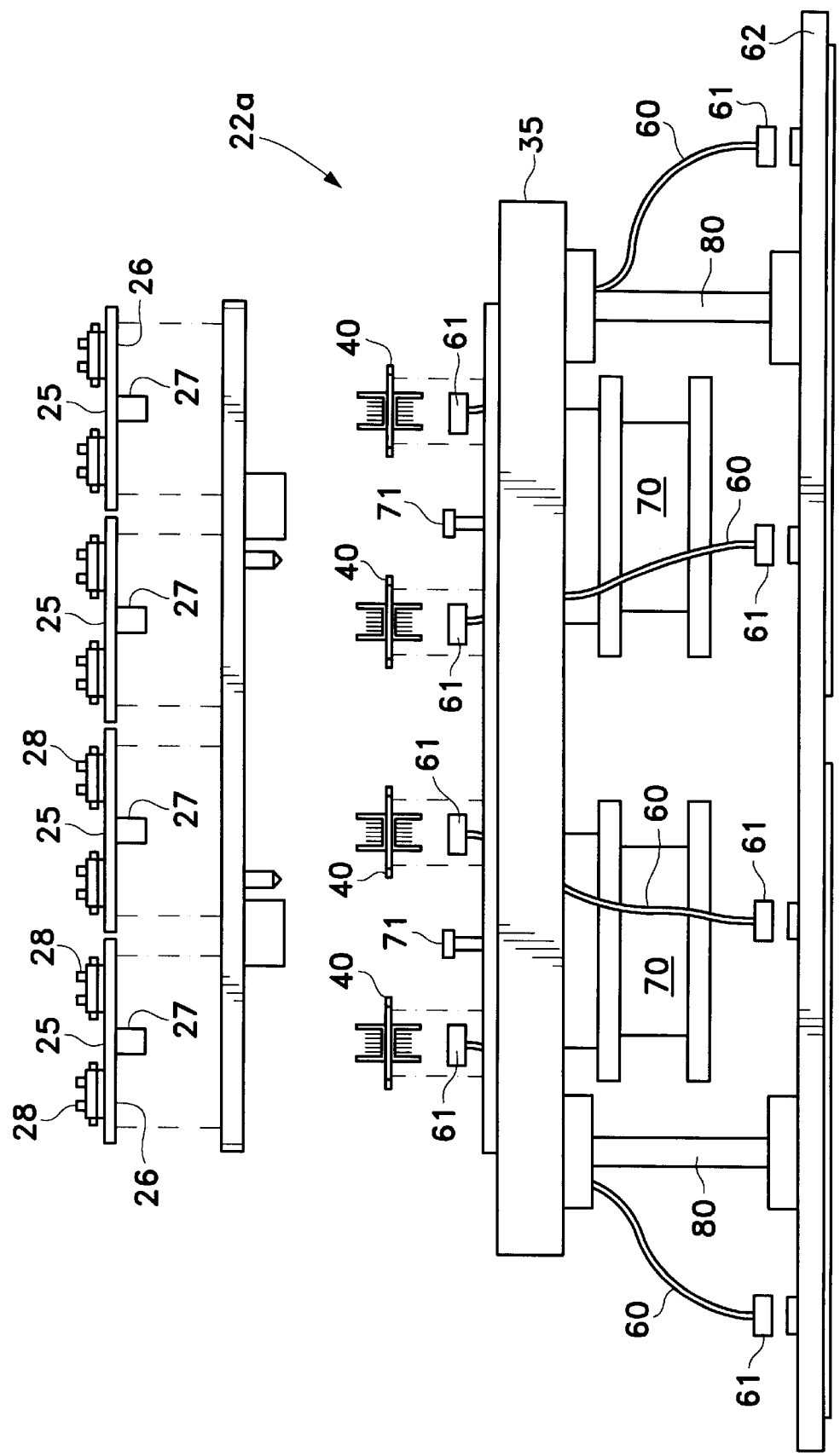
FIG. 3 is an exploded elevation, illustrating, from top to bottom, the test boards with their pin connectors, the socket plate, the male header pin assemblies, the housing, and the docking plate containing the pneumatic actuators having coaxial cables extending to the test head loadboard.

In reference to the technology, FIG. 1 illustrates a chip testing machine 20 having a robotic chip handler 21, an interface system unit 22 and a mainframe computer 23. When chips are under test the interface system unit is moved into the robotic chip handler on rails 24 provided for this purpose and oriented so that the chip test boards 25 on the surface of the interface 22a, as opposed to the system unit, are precisely positioned in the handler, as there is a degree of float between the interface 22a and the system unit 22.

When the interface is so positioned the handler can insert chips in the chip test boards and remove the chips automatically after test, along with sorting the chips after they are removed based on the test data received from the mainframe computer.

The chip testing machine illustrated in FIGS. 1 and 2 use dual interface system units 22 in the interest of efficiency and, as can be seen in these drawings, the interface system units are mounted on tracks so that the units can be rolled into the chip handler 21 where the interfaces are secured with interlocks in a precise orientation within the chip handler. As the chip handlers are well know devices, such units, will not be further described, nor are the controls, chip feeders, etc. associate therewith, illustrated since the handler does not form part of the invention.

At the end of a product run, the interface 22a and the interface system unit 22 are released and rolled out of the handler 21 in order that new chip test boards 25 can be placed in the interface 22a, which according to this invention can be accomplished in a highly efficient manner.

Figure 6:
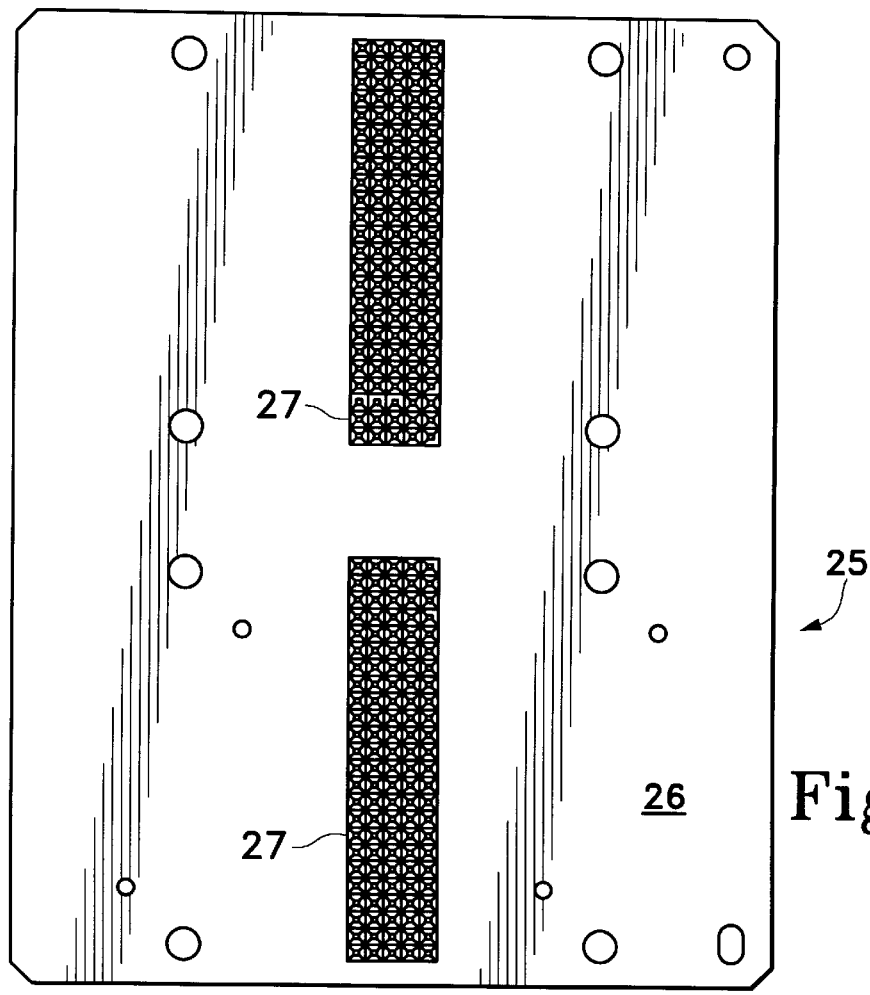
FIG. 6 is the under side of a test board illustrating its associated female pin connector.

To better understand how this is accomplished reference is made to FIG. 3, an exploded elevation, illustrating the chip test boards 25 at the top of the drawing. In this embodiment each chip test board has on its under side 26 a pair of female pin connectors 27, as better illustrated in FIG. 6. On the top of the each test board are four test socket mounting arrays in which test sockets 28 are inserted. The pin outs of the female pin connectors 27 on the top of each chip test board are connected to the pin outs for each test socket using printed circuit technology. Thus, when the proper sockets are inserted into these test boards, each chip test board is product specific. This arrangements keeps the leads on the boards very short and reliable improving the electrical connection integrity.

Figure 4:
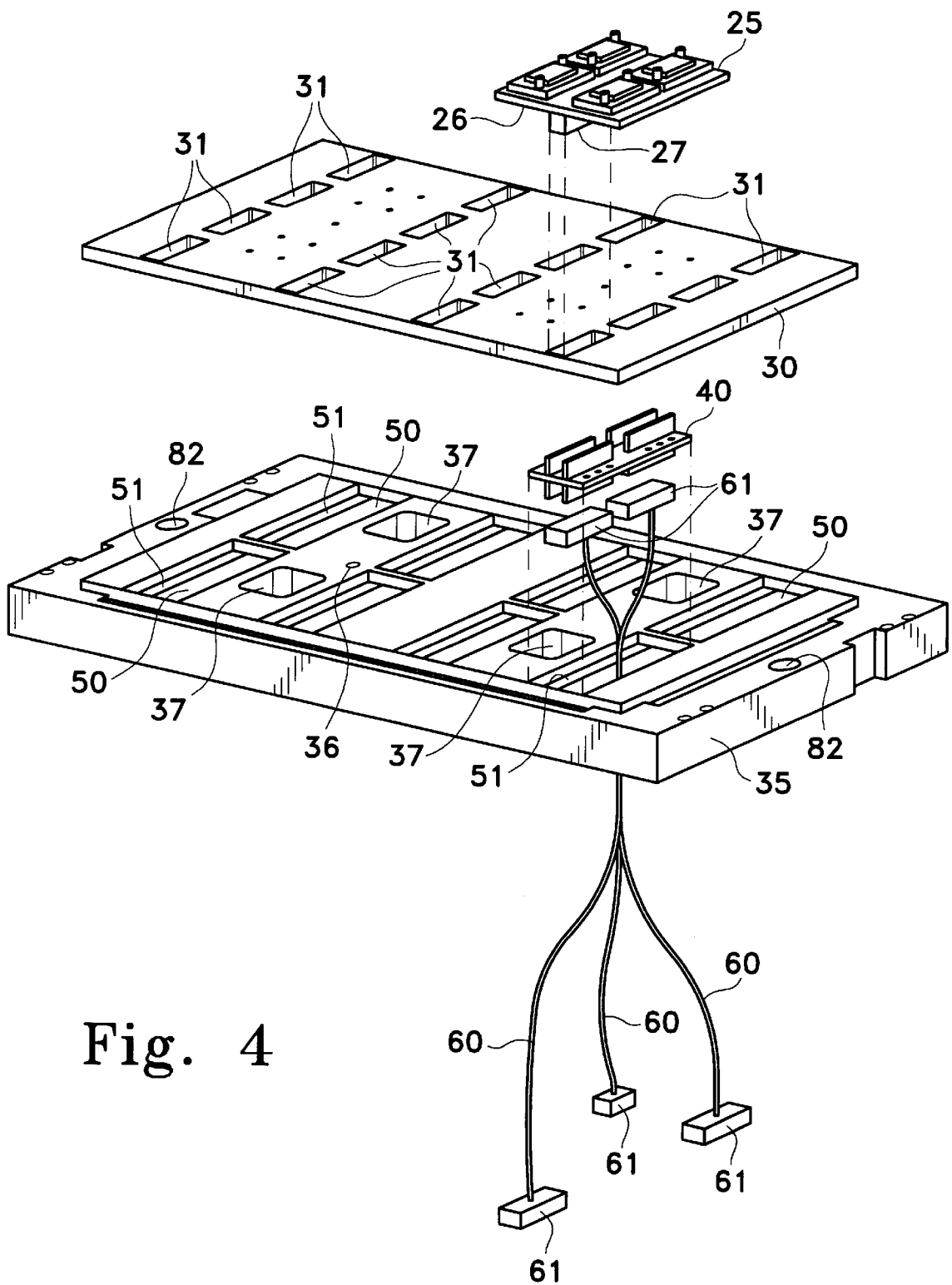
FIG. 4 is an exploded perspective illustrating, among other things, the arrangement between the connector on a test board, its pin connector, a header assembly and its connection to the coaxial cables.

Again referring to FIG. 3 a socket plate 30 is illustrated which is the support for eight of the chip test boards 25 which are screwed or otherwise fixed to the surface to the top of the socket plate after the female pin connectors 27 are received in apertures 31 formed in this plate (see FIG. 4 for a better illustration of the apertures in the plate and how each chip test socket is received thereon). It must be appreciated that individual chip test boards are precisely located on the socket plates and short dowels (not shown) can be use to precisely locate these boards.

Now referring to FIGS. 3 and 4 it can be seen that the underside 32 of the socket plate 30 has dowels 33 and 34 which provide guides to ensure this plate properly mates with the housing plate 35 having bores 36 and pockets 37 which receive dowels 34 and 33, respectively, when these two plates are mated with one another.

Mounted on the surface of the housing plate 35 are a plurality of male header pin assemblies 40, which are dual headers, that is headers having pins extending straight through each header so that a female pin connector can be plugged on the pins from each direction, as illustrated in FIG. 4. It should be understood however the invention is not limited to such dual header assemblies as plugs used to connect coaxial cables to these assemblies could be eliminated and the cables hardwired to headers having only pins facing the socket plate.

Figure 7:
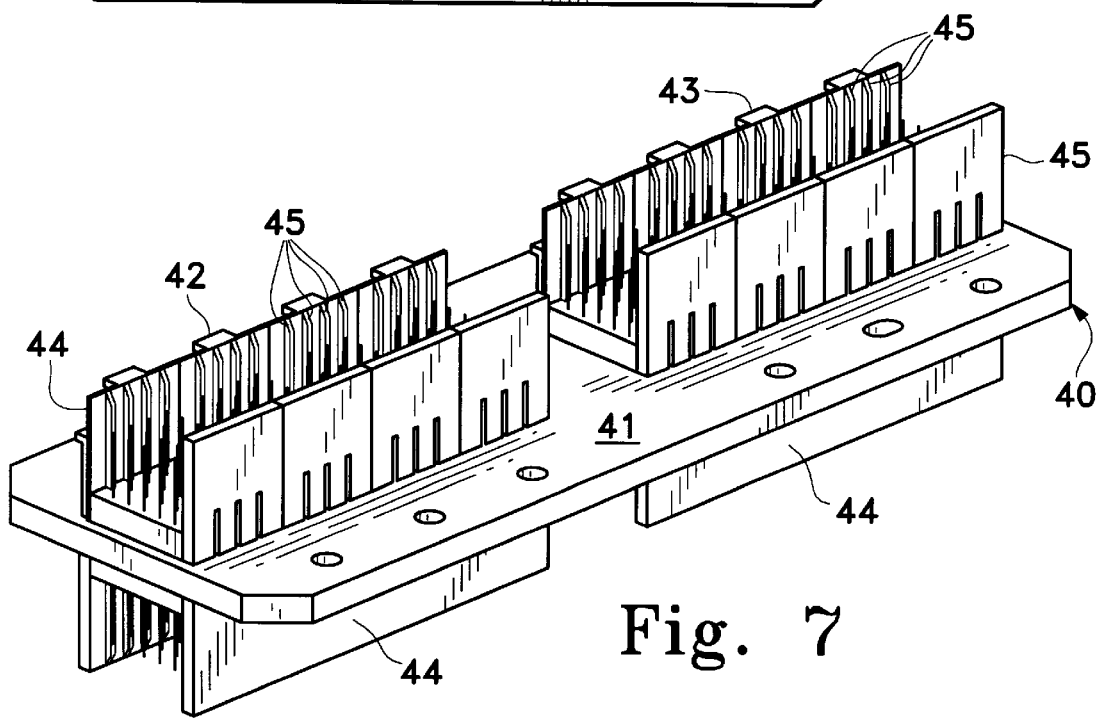
FIG. 7 is a perspective of the male header pin assembly providing connection between a test board and a coaxial cable.

As to construction of the header assemblies 40, reference is made to FIG. 7, illustrating one of the assemblies in perspective. As can be seen a base plate 41 forms a mounting flange for two such headers 42 and 43, each of which is formed by a u-shaped channel on opposite sides of the mounting flange with a plurality of pins 45 passing completely through the channels and the mounting flange whereby these pins are accessible on opposite sides of the mounting flange. In the drawings the pin pattern, due to drawing restrictions, is only illustrative, as the density of the pins is much greater than shown therein.

Referring to FIGS. 3 and 4, it can be seen that the male header pin assemblies 40 are mounted in apertures 50 in the housing plate 35, which apertures are further relieved at their tops to form a groove 51 about the top of each aperture to receive a mounting flange 41 of a header assembly in a flush relationship. These mounting flanges are fixed to the housing plate with screws or the like. Obviously by using the dual header assemblies described, it is relatively easy to change out these assemblies if one of the pins 45 is bent or broken. Experience teaches that is nearly impossible to straighten these pins if they are bent, making the ability to unplug a cable attached to the bottom of these assemblies and replace the individual header units, a real advantage in the novel interface of this invention.

As indicated the employment of the dual headers 40 has advantages and this can be appreciated by the illustrations in FIGS. 3 and 4 wherein multiple coaxial cables 60 are shown having female pin connector plugs 61 on each end. As can be appreciated one of these plugs can plug into the bottom of the male header pin assemblies on a more or less permanent basis and the opposite end plugged into what is called the test head loadboard 62. This loadboard is conventional and provides the downstream circuitry from the headers, along with the cabling necessary to connect each male header pin assembly to mainframe computer 23 that effects the tests of the chips placed in the chip test boards 25.

Figure 5:
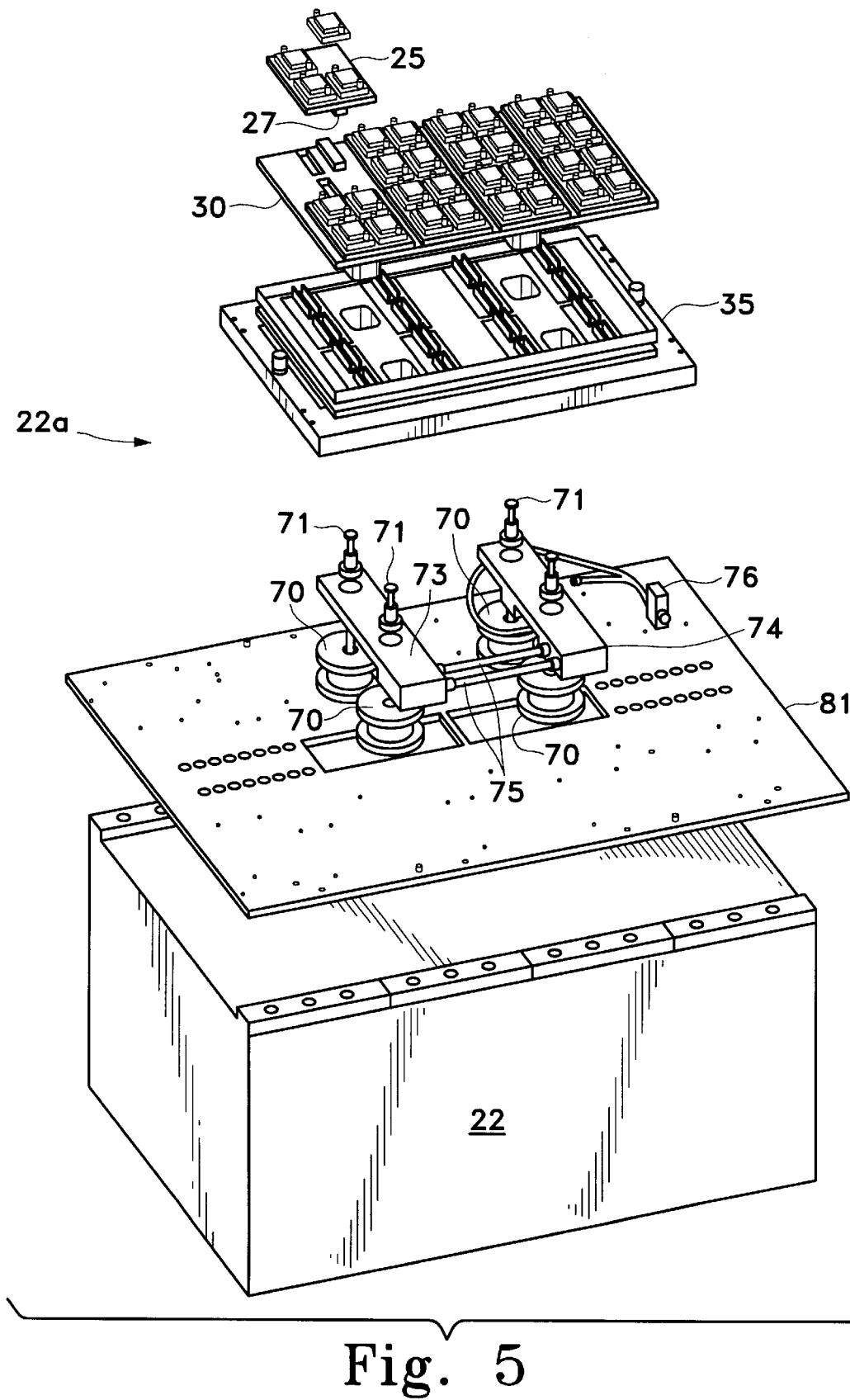
FIG. 5 is an exploded prospective, similar to the elevation illustrated in FIG. 2 but without the male header pin assemblies and coaxial cables.

Referring to FIG. 5 it can be seen that a large number of connections must be made between the female pin connectors 27 on the chip test boards 25 and the pins 45 of the male header pin assemblies 40 to operate the novel interface 22a. With the pin density involved, forces approaching, or in excess of, three hundred pounds may be required to make these connections. Not surprising the same force, or greater is necessary to effect a disconnection. Further, since the pins can be easily bent such forces used for connecting and disconnecting must be distributed in a uniform pattern on the socket plate 30 with the pins precisely aligned with the female pin connectors.

To accomplish this mated (connected) relationship between the socket plate and the housing plate 35 mechanical actuators 70 are employed. Typically these actuators will be pneumatic and have top hat pins 71 that extend from the actuators. Traditionally these actuators are mounted so that the top hat pins extend through the pockets 37 that receive the larger dowels 33 of the socket plate. This allows the actuators to be mounted on the underside of the housing plate or the structure supporting the housing plate; however it is preferable to mount the actuators on the housing plate.

Figure 8:
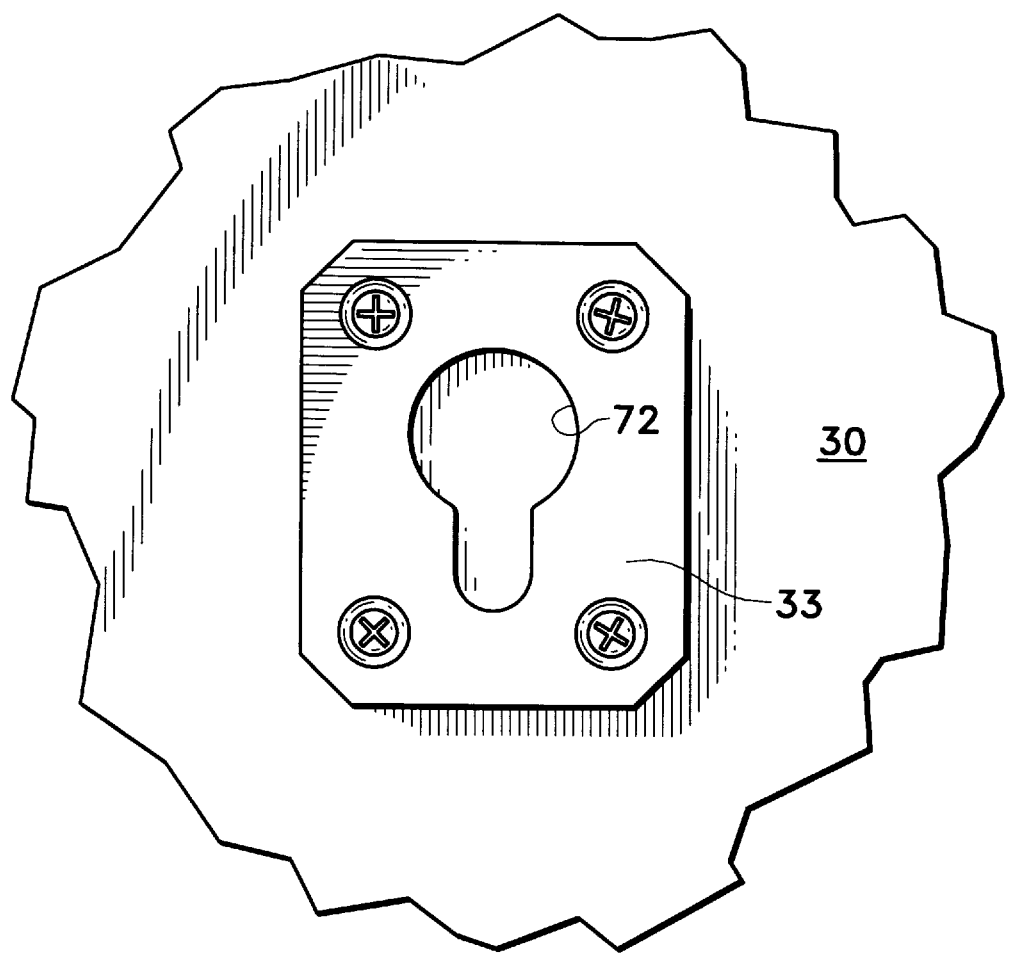
FIG. 8 is a plan view of one of the larger dowels on the bottom of the socket plate illustrating the key-hole connection for the actuators.

As illustrated in FIG. 8 the bottom of the larger dowels 33 on the bottom of the socket plate 30 are milled to receive the top hat pins 71 in a key-hole type slot 72 so that the enlarged heads of the pins can pass into the bottom of these dowels and support the socket plate. Thereafter the socket plate is shifted horizontally to lock the socket plate to the actuator pins. It is preferred to counter bore dowels 33 so that the top of the pins are received in such counter bores (not shown), thereby aligning the socket plate with the housing plate. As the pins move into the counter bores the socket plate drops down slightly and as a result of guards 96, it is not possible to catch tie operator's fingers under the socket plate when the actuators are energized when the socket plate is properly installed. However, other types of locking means between the actuators and the socket plate can be employed; in the embodiment shown four top hat pins are employed with the actuators so that the socket plate is moved into the housing plate 35 in a parallel relationship relative to the housing plate.

Actuators 70 are mounted in two mounting assemblies 73 and 74 which are connected to the underside or the housing plate 35 with screws. Since the actuators illustrated are pneumatic, they are plumbed with conduits 75 in a manifold built into each assembly, one of which manifolds is connected to an air pressure quick disconnect fitting 76. When the interface system unit 22, moves into the chip handler 21 there is no need to have air pressure connected to it, thus once the socket plate 30 is mated with the housing plate 35, the air pressure source is disconnected from the fitting 76. Within one of the manifolds is an electrically operated air valve (not shown) which is controlled by a three position switch (also not shown) having an "off" position, a "lock" position and a "unlock" position. It can be appreciated with the source of air pressure connected to the disconnect fitting, and the socket plate properly mounted on the top hat pins 71 the switch can be temporarily moved to the "lock" position causing the socket plate to mate with the housing plate, with the actuators providing the three hundred pounds of force, more or less, required to make the connections between the female pin connectors 27 and the male header pin assemblies 40. Once the connections are made the switch is moved to the "off" position. Since the switch and valve mentioned are conventional pneumatic appliances they are not illustrated and are well within the knowledge of those skilled in the art.

While the invention is disclosed with reference to pneumatic actuators it is within the compass of the invention to use other types so actuators that will cause the socket plate 30 to mate with the housing plate 35 in a parallel relationship. Also as the socket plate approaches the housing plate the dowel pins 33 and 34 ensure that these plates are properly aligned so that female pin connectors 27 will be aligned with the pins 45 of the headers 40 as these dowels engage the housing plate before the connectors engage these pins.

As can be seen in FIG. 3 the housing plate is supported on vertical posts 80 that traditionally extend from a docking plate 81 (See FIG. 5), in the alternative these vertical posts can be mounted on plates located directly on the test head loadboard 62, as illustrated in FIG. 3. Generally the docking or support plate is employed to accommodate the existing test head loadboard and avoid localized pressures on the test head loadboard which is not substantial. The vertical posts are typically designed so that the housing plate 35 when secured to these posts has a degree of float. This float is desired in order that the housing plate, when it is within the chip handler 21 can be clamped precisely within the chip handler without disturbing the docking plate and/or test head loadboard below it. As to this relationship bores 82 housing plate (see FIG. 4) receive dowels (not shown) in the chip handler and clamps engage the underside of the housing plate, lifting it slightly on the dowels for a very precise location within the chip handler 21.

Part of the interface system unit 22 is a cart 83 which is mounted on the rails 24 designed specifically for accomplishing rapid product changes using this invention, so that it can be rolled into the chip handler 21 once the interface is ready for testing chips. This cart carries the test head loadboard 62 and, with the rails, is a unique innovation in the robotic chip testers. Further the interface structure above the loadboard is the greater innovation, and has the advantage that it weighs considerably less than the prior art systems employed for product changes in automatic chip testers of the type described.

As can be seen in FIG. 2 the computer mainframe 23 is also mounted on a cart 97 shown in FIG. 1 so that it can move back and forth, that is toward and away from the chip handler 21. Traditionally the computer is fixed in an automated chip testing machine because it requires considerable power and also liquid cooling. In the current invention provisions for the electric power and cooling medium is accomplished through a tractor or rolling cable 90. An appliance box 91 is fixed to the computer in which the electrical and cooling connections are made at one end of the tractor cable attached to this box to provided these services or requirements.

As can be seen in FIG. 2 the cable 90 is flexible and deployed in a large loop so that as the computer 23 moves toward the chip handler 21 the cable will be laid down like a track on a track type vehicle. The distal end of the cable is coupled to a stationary junction box 92 wherein it is connected to an electrical service through cable 93 and to a coolant unit (not shown) through conduits 94 and 95. Cables of this type are available commercially and have flexible internal conduits disposed in a flat web of rubber or other elastomer. In essence it is like a flat belt with internal passages. In the preferred embodiment, however, a segmented belt is used, such as the product sold as E-Chain by Igus Corporation, which when connected between the appliance box 91 and the junction box, functions as described herein.

With the computer mainframe 23 mounted on a cart (wheels) using the same tracks 24 which are provided for the interface system units 22, it can be appreciated that the critical cabling between the test head loadboard 62 can be shortened and, more or less, fixed if these two units are attached (coupled) so that the interface system unit and the computer move toward and away from the chip handler as one unit. The test head loadboard in the interface system unit is connected to the computer through cabling (not shown) and these connections are critical. Eliminating movement of the cabling between the interface system units and the computer, provides a more reliable tester. Obviously the provision of electrical power and cooling to the computer mainframe is far less critical than its circuit connections to the chips being tested.

It is not intended that the invention be restricted to the precise embodiment illustrated, and persons skilled in the art will be able to use other variations with the umbrella of the invention.

Having described our invention, we claim:

1. An interface device designed to accomplish rapid product changes in a robotic chip testing machine comprising:

a support plate having a plurality of vertical supports mounted thereon, a housing plate mounted on said support plate on said vertical supports, said housing plate having a plurality of pneumatic actuators associated therewith and operable to access assemblies above said housing plate;

a plurality of male header pin assemblies mounted on the surface of the housing plate; and a socket plate with a plurality of apertures which register with said plurality of said header assemblies, said socket plate having coupling means operable to engage and disengage with said actuators whereby when said coupling means is engaged energizing said actuators will move said socket plate toward the housing plate causing the pin portions of said header assemblies to be received in the apertures in the socket plate thereby connecting any female pin connectors disposed in these apertures to be connected to one of said header assemblies and reversing said actuators will disconnect all of said female pin connectors.

2. The interface device in claim 1 wherein chip test printed circuit boards with female pin connectors on the bottom thereof are mounted on said socket plate so that said pin connectors extend into the apertures of said socket plate whereby said pin connectors are received on the pins of the header assembly associated with these apertures when the actuators move the socket plate toward the housing plate and will be disconnected when said actuators move said socket plate away from said housing plate.

3. The interface device in claim 1 wherein dowel means are disposed between the socket plate and the housing plate ensuring registry therebetween when the actuators move said socket plate toward said housing plate.

4. The interface device in claim 1 wherein coaxial cables are connected to the header assemblies having plugs on their distal ends whereby said cables can be connected to circuits for testing chips mounted in said interface device.

5. The interface device in claim 1 wherein the vertical supports include float means operable to allow slight movement or float between the docking plate and the housing plate in order that the housing plate can be properly mounted in the chip handling device.

6. The interface device in claim 1 wherein the actuators are pneumatic actuators.

7. The interface device in claim 1 wherein the support plate is the test head loadboard of a interface system unit.

8. The interface device in claim 1 wherein the support plate is the docking plate which mounts on the test head loadboard of a interface system unit.

* * * * *